United States Patent [19]
Sato et al.

[11] 4,301,540
[45] Nov. 17, 1981

[54] ELECTRONIC TUNING TYPE RECEIVER WITH DIGITAL TO ANALOG CONVERTER

[75] Inventors: Reisuke Sato, Kawagoe; Tadashi Ogawa, Tokorozawa, both of Japan

[73] Assignee: Pioneer Electronic Corporation, Tokyo, Japan

[21] Appl. No.: 938,143

[22] Filed: Aug. 30, 1978

[30] Foreign Application Priority Data

Aug. 30, 1977 [JP] Japan .................................. 52-103983
Aug. 30, 1977 [JP] Japan .................................. 52-103984

[51] Int. Cl.³ .............................................. H04B 1/16
[52] U.S. Cl. ...................................... 455/180; 361/92;
365/227; 365/228; 455/186; 455/343
[58] Field of Search ................... 325/464, 455, 492;
358/191; 365/226–229; 307/126, 130, 64, 86, 87, 150; 361/92; 455/343, 180, 185, 186

[56] References Cited

U.S. PATENT DOCUMENTS

| | | | |
|---|---|---|---|
| 3,949,307 | 4/1976 | Klank et al. | 325/455 |
| 3,968,440 | 7/1976 | Ehni | 325/464 |
| 4,005,344 | 1/1977 | Gaind et al. | 361/92 |
| 4,058,772 | 11/1977 | Mogi et al. | 325/464 |
| 4,104,734 | 8/1978 | Herndon | 365/228 |

OTHER PUBLICATIONS

Schmid, "Electronic A/D Conversions", Van Nostrand Reinhold Co., N.Y., 1970, pp. 204–205.

*Primary Examiner*—Marc E. Bookbinder
*Attorney, Agent, or Firm*—Sughrue, Mion, Zinn, Macpeak & Seas

[57] ABSTRACT

An electronic tuning type receiver comprises a digital-to-analog conversion section having a memory adapted to store a digital input value obtained by counting pulses generated by a manual operation. In one embodiment an up-down counter is also employed. A digital-to-analog conversion process section generates a pulse signal having a number of pulses per unit time corresponding to an output of the memory or counter and a tuning section receives as a tuning signal, an analog output signal of the digital-to-analog conversion section. The receiver further comprises an electric source "off" state detecting circuit which, in one embodiment only when both of the outputs of the digital-to-analog conversion process section and an electric source thereof are brought to be in "off" state, operates to suspend the operations of relevant sections of the receiver. In another embodiment the up-down counter and pulse oscillator are suspended when the power is switched off.

26 Claims, 6 Drawing Figures

ELECTRONIC TUNING TYPE RECEIVER WITH DIGITAL TO ANALOG CONVERTER

BACKGROUND OF THE INVENTION

This invention relates to electronic tuning type receivers, and more particularly to an electronic tuning type receiver using D/A converters in which the power consumption can be considerably reduced whenever the electric power source is be brought to an "off" state.

As a result of contemporary progress in electronics, a variety of electronic tuning type receivers have been proposed. In electronic tuning systems, control of a receiving frequency is effected by voltage-controlling a variable capacitance in the tuning section. For this purpose, a variety of tuning voltage control systems have been proposed. In one such system, the tuning voltage is represented by a digital value in view of the stability of such a signal.

The digital value is subjected to a digital-to-analog conversion with the analog output employed as a tuning control voltage. For this purpose, a variety of digital-to-analog (D/A) converters are known and disclosed in this art.

A preferable D/A converter is formed using a pulse synthesizer and a low-pass filter because the number of terminals involved is a factor in providing the D/A converter in the form of an integrated circuit. In the pulse synthesizer, the output of pulse oscillator is subjected to frequency division with a frequency divider having a plurality of stages. The frequency division output of the stages of the frequency divider are selectively synthesized corresponding to a parallel digital signal into a serial pulse train which corresponds to the digital signal. The pulse train is applied to the low-pass filter to obtain a DC voltage.

These circuits are included in a station-selecting-voltage generating section which is in the form of an integrated circuit. The station-selecting-voltage generating section has a preset circuit. In this section, a requirement exists to maintain stored signals even after the power switch is turned off, and accordingly an auxiliary electric source with a capacitor is employed to continuously supply current to the section after the receiver power switch is turned off.

The station-selecting-voltage generating section has circuit elements which consume electric power in addition to the memory adapted to store the preset values. For example, the pulse oscillator used to supply pulses to the pulse synthesizer consumes a relatively large amount of electric power. Accordingly, the electric power consumption will be high while the power switch is in an "off" state. Therefore, in the situation where the storage element is maintained with the aid of the auxiliary electric source while the power switch is in the "off" state, it becomes difficult to maintain the preset conditions for a long period of time.

Since a small amount electric power is supplied to the station-selecting-voltage generating section to maintain the preset value, at all times, if a pulse signal is applied thereto for some reason while the power switch is in the "off" state, it may cause erroneous operations, or a frequency received may be shifted.

Referring now to FIGS. 1 and 2 a generic example of a digital-to-analog converter circuit with a memory function is shown. It comprises a digital-to-analog (D/A) conversion process section 1 for converting a digital input into a signal having a corresponding period or pulse width. A resistor 2 and a capacitor 3 form a low-pass filter section 25 adapted to pass only the low frequency components of the output of the D/A conversion process section 1 and to apply an analog signal to an output terminal 4. A memory 5 is adapted to store a digital input and to control the conversion operation of the D/A conversion process section 1 in accordance with the contents stored therein. A clock signal generator 6 applies a clock signal to the D/A conversion process section 2 and the memory 5. A diode 7 and a capacitor 8 form an electric source input section to the D/A conversion process section 1, the clock signal generator 6 and the memory 5. A resistor 9 and a capacitor 10 form an electric source "off" state detecting circuit adapted to supply a signal to the D/A conversion process section 1, the memory 5 and the clock signal generator 6 when the electric source is in "off" state. The discharge current of the capacitor 8 obtained when the electric source is in "off" state is employed as an auxiliary electric source.

In the D/A converter circuit of FIG. 1 upon application of the electric source Vcc, the electric sorce Vcc is applied through the diode 7 to the capacitor 8 to charge it and then it is applied to the various circuit elements. Furthermore, upon application of the electric source Vcc, the capacitor 10 is charged through the resistor 9, and hence the signal to the various circuit elements is released.

In this condition, a digital input signal is applied to the D/A conversion process section 1, and the converter generates an output signal having a period or pulse width corresponding to the input value in accordance with the output of the memory 5.

The pulse signal generated by the D/A conversion process section 1 is, for instance, as indicated in FIGS. 2 (a) or (b). The output signal of the D/A converter 1 is converted in to an analog signal, as indicated by the dotted line in FIGS. 2(a) or (b) by means of the low-pass filter 25 comprising resistor 2 and capacitor 3. The analog signal is applied, as a tuning signal, to a tuning section (not shown) through the output terminal 4.

If the electric source Vcc is brought to the "off" state, the output of the electric source "off" state detecting circuit formed with the resistor 9 and the capacitor 10 has a low level "L" signal and as a result, the signal is supplied to the various circuit elements to stop the operations.

However, in the D/A converter circuit of the general type shown in FIG. 1, the consumption current is considerably increased depending on the timing of generating the electric source "off" state detecting signal. The output stage of the D/A converter 1 is typically made up of a CMOS integrated circuit or the like. Therefore, if the detecting signal is supplied to interrupt the operation of the section 1 with the output signal being at a level "H" signal, then the output signal flows continuously in the load, and therefore the capacitor 8 employed as the auxiliary electric source is instantly discharged.

On the other hand, if the detecting signal is produced when the output signal of the D/A conversion process section 1 is at "L", the consumption current in this section is zeroed, and only the static current for maintaining the storage in the memory 5 is allowed to flow. Thus, the total amount of consumption current becomes very small, and therefore the data in the memory can be maintained by the capacitor 8 for a long period of time.

As is apparent from the above description, in this type of digital-to-analog converter, the amount of consumption current is greatly varied and furthermore the data maintaining period of time is also varied depending on the timing of generating the electric source "off" state detecting signal. The probability of increasing the data maintaining period of time in the case of FIG. 2(a) is higher than that in the case of FIG. 2(b) because the high level period in the former case is longer than that in the latter.

SUMMARY OF INVENTION

Accordingly, an object of this invention is to provide an electronic tuning type receiver in which the power consumption required for maintaining the memory after the power switch is in the "off" state is reduced, and the erroneous operations which otherwise may be caused while the power switch is in the "off" state are positively prevented.

It is another object of this invention to provide a digital-to-analog system conversion system in which power consumption can be minimized wherever the power source is in an "off" state.

Yet another object of this invention is to provide an electronic tuning type receiver where data may be held in a memory while other system components are disabled when the power switch is off and more particularly where the clock and counter functions are disabled.

Still another object of this invention is to provide a disable circuit in an electronic tuning type of receiver that is responsive to a power "off" signal and a signal level from a digital-to-analog converter thereby rendering it inoperative during the power "off" period.

These and other objects of this invention are accomplished by the use of a novel digital-to-analog circuit used in an electronic tuning type of receiver. The receiver, in one embodiment, comprises a pulse generator generating up or down pulses as a result of manual operation of the receiver. A counter receives the pulse output and is coupled to a D to A converter. The analog output is applied to a low pass filter and then to a variable tuning capacitance. The operation of the counter and pulse generator are suspended by a disable signal when the receiver power switch is turned off.

In a second preferred embodiment a disable signal is generated to suspend operation of the synthesizer and therefore of the entire digital-to-analog section when the power is "off" and the digital synthesizer produces no output. At the same time the clock functions are discontinued. The disable signal is generated only when the D/A converter output is at a low level to supply one signal input to an inverter network coupled to a NAND gate. The other low level signal is generated as a result of a power "off" level to another inverter thereby delivering a low level disable signal to the system.

DESCRIPTION OF THE PREFERRED EMBODIMENTS

Figure 1:
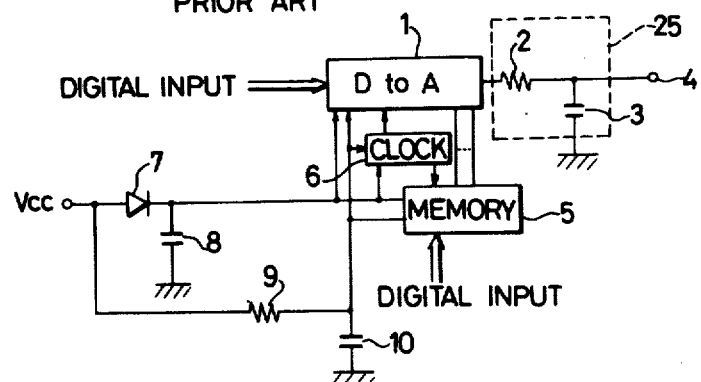
FIG. 1 is a circuit block diagram showing a conventional digital-to-analog conversion system.
Figure 2A:
FIGS. 2(a) and (b) are waveform diagrams showing the output of the digital-to-analog conversion process of FIG. 1.
Figure 2B:
Figure 3:
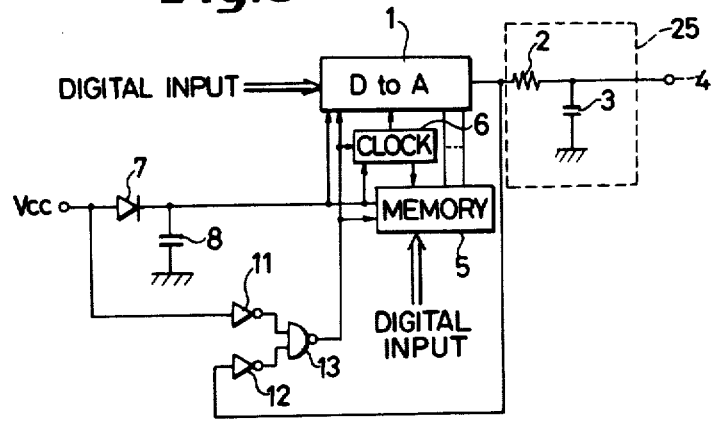
FIG. 3 is a circuit block diagram showing a first embodiment of a digital-to-analog converter with this invention.

This invention will be first described with reference to FIG. 3, which is a block diagram illustrating essential components of a first example of a digital-to-analog converter according to this invention. In FIG. 3, those components which have been previously described with reference to FIG. 1 have therefore been similarly numbered.

The additional circuitry shown in FIG. 3 essentially comprises a first inverter 11 for inverting the output of the electric source; a second inverter 12 for inverting the output of the D/A converter 1; and a NAND gate 13 receiving the outputs of the two inverters 11 and 12. The two inverters 11 and 12 and the NAND circuit 13 form an electric source "off" state detecting circuit.

In the circuit of FIG. 3, the output of the inverter 11 is raised to "H" when the electric source is in the "off" state. When the output of the D/A converter 1 is changed to "L", the output of the inverter 12 is also raised to "H". At this point in time, the output of the NAND gate 13 is "L" for the first time, that is, an electric source "off" state detecting signal is generated.

In the circuit of FIG. 3 when the outputs of the electric source and the D/A conversion process section have "L" level, the detection signal is generated. Therefore the operation of the D/A converter 1 is suspended only when the output of the converter is at "L". Accordingly, the power consumption in the system is reduced.

An electric source for the electric source "off" state detecting circuit is designed that it is maintained until the delivery of the electric source "off" state detecting signal is complete.

As is apparent from the above description, the operation of the circuits other than the memory are suspended by the signal provided only when both of the outputs from the electric source and the D/A converter are at a level "L". Accordingly, only current for holding the data in the memory is consumed in the system after said signal is produced. Therefore, the power consumption of this circuit is considerably reduced over the prior art, yet the data in the memory can be maintained by the auxiliary electric source for a long period of time after the electric source is brought to the "off" state.

Figure 4:
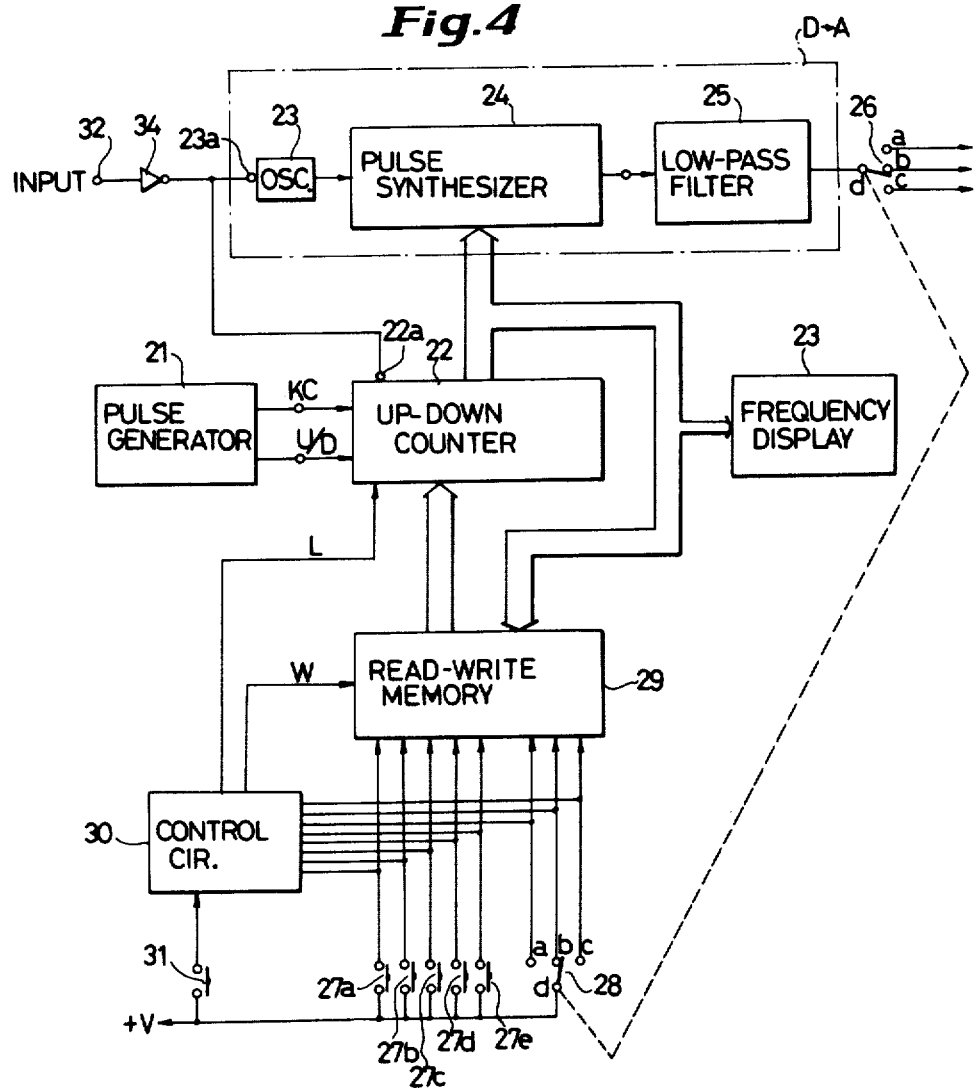
FIG. 4 is a block diagram of a first embodiment of an electronic tuning type of receiver according to this invention.
Figure 5:
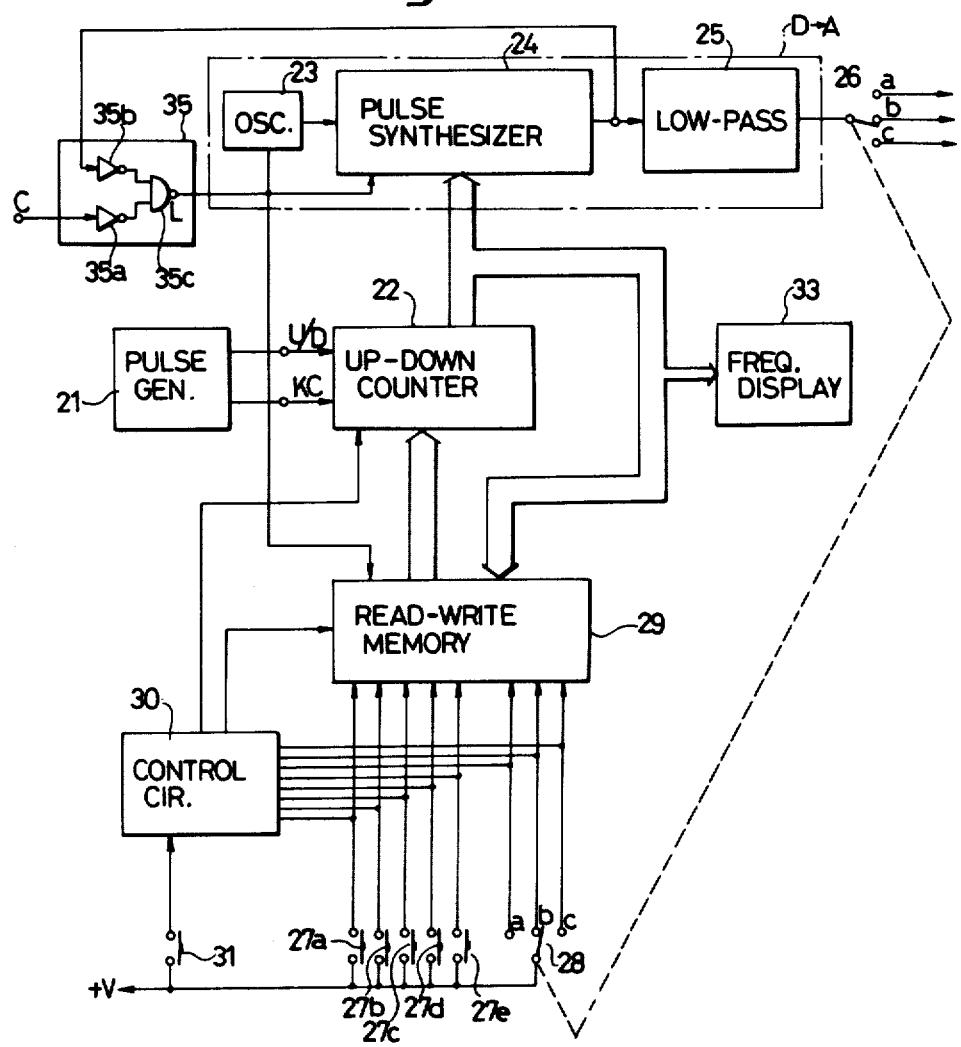
FIG. 5 is a block diagram of a second embodiment of an electronic tuning type of receiver according to this invention.

Referring now to FIGS. 4 and 5, the preferred embodiments of the receiver aspects of this invention are shown. The receiver is of the electronic tuning type employing an up-down counter responsive to memory output. A digital-to-analog converter section is used to provide a pulse train having a number of pulses corresponding to counter output that is converted into an analog signal by means of a low pass filter network. The output signal is applied to the tuning circuit of the receiver. In such devices, a requirement exists that the memory contents, that is the output of channel selecting switches, be held while the system is not being used. Additionally, the power requirements should be minimized to avoid unnecessary consumption.

This invention in its receiver aspects disables the D to A converter either by discontinuing the input oscillator function or by affirmatively disabling the pulse synthesizer upon receipt of a low level signal.

Referring now to FIG. 4, a first preferred embodiment of receiver is shown in a block diagram. The electronic tuning type receiver, as shown in FIG. 4 comprises a pulse generator 21 adapted to produce an up-/down pulse U/D and a clock pulse KC. A binary up-down counter 22 receives the up-pulse U or down-pulse D provided by the pulse generator 21, as a count pulse input and has a count control terminal 22a so that it carries out its count operation only when the input signal is at a low logical level (hereinafter the input signal being referred to as the "L" input signal, when applicable). A pulse oscillator 23 carries out its oscillation function only when an input at a low logical level (hereinafter referred to as an "L" input, when applicable) is applied to its oscillation control terminal 23a.

A pulse synthesizer 24 generates output signals by receiving the oscillation signal of the pulse oscillator 23 and frequency dividing it by selective synthesization with the aid of the output signal of the up-down counter 22. The output of synthesizer 24 is a serial pulse train, the number of pulses of which corresponds to the output of the up-down counter 22. A low-pass filter 25 is connected to the output of the pulse synthesizer 24. The low-pass filter 25, the pulse oscillator 23 and the pulse synthesizer 24 form a digital-to-analog (D/A) converter section. Such a pulse synthesizer is disclosed in U.S. Pat. No. 3,603,977.

The electronic tuning type receiver further comprises a band selecting switch 26 adapted to selectively supply the DC output of the low-pass filter 25 to a tuning circuit (not shown) thereby to select a desired band. The switch is provided with stationary contacts a, b and c respectively for bands A, B and C. Channel selecting switches 27a through 27e are provided and are a non-lock type of switch. A band selecting switch 28 has stationary contacts a, b and c respectively for the bands A, B and C, and the switch 28 is operated in a ganged operation with the band selecting switch 26 as shown by the dashed line.

A read-write memory 29 is adapted to store the outputs of the up-down counter 22 in addresses specified by the outputs of the channel selecting switches 7athrough 7e and the band selecting switch 8. The memory will also read data stored in addresses specified by the outputs and to supply them to the up-down counter 22. The read-write memory 29 functions to latch input signals. A control circuit 30 receives the outputs of the channel selecting switches 27a through 27e and the output of the band selecting switch 28.

In a situation where a preset switch 11 is in the "off" state, the control circuit 30 applies a load signal L to the up-down counter 22 when any of the channel selecting switches 27a through 27e provides its output. Furthermore, in the case where the preset switch 11 is in an "on" state, the control circuit 30 supplies a write signal W to the read-write memory 29.

The receiver also comprises a frequency display unit 33 which receives the five (5) higher significant bits signal of the data of the up-down counter 22 to effectuate digital display of the frequency using light emission diodes. An enable terminal 32 receives a signal at a high logical level (hereinafter referred to as an "H" signal, when applicable) which is applied when a power switch (not shown) is turned on and an inverter 34 is adapted to invert the enable signal applied to the enable terminal 32. The output signal of the inverter 34 is applied to the count control terminal 22a of the up-down counter 22 and also the oscilation control terminal 23a of the pulse oscillator 23.

In the circuit as shown in FIG. 4, a signal at a low logical level (hereinafter referred to as an "L" signal, when applicable ) is applied to the enable terminal when the power switch (not shown) is turned off. The "L" signal is inverted into an "H" signal by the inverter 34, and is applied to the count control terminal 22a of the up-down counter 22 and to the oscillation control terminal 23a of the pulse oscillator 23, as was described above. Accordingly, the up-down counter 22 suspends its counting function and therefore erroneous operations are prevented. These errors may result while the power switch is in the "off" state. Also, the pulse oscillator 23 suspends the generating of pulses and hence the power consumption is reduced while the power switch is turned off.

When the power switch is turned on, the "H" signal is applied to the enable terminal 32 and it is inverted into the "L" signal by the inverter 34. This "L" signal is applied to the count control terminal 22a of the up-down counter 22 to permit the counting operation of the latter 22, and it is also applied to the oscillation control terminal 23a of the pulse oscillator 23 to permit the generation of oscillation pulses. In this condition, the pulse generator 21 is operated to generate, for example, an up-pulse U, which is applied to the up-down counter 22. As a result, the up-down counter 22 successively counts up the clock pulses KC outputted by the pulse generator 21. The parallel count output of the up-down counter 22 is applied to the pulse synthesizer 24, where signals are obtained by subjecting the oscillation signal of the pulse oscillator 23 to frequency division.

In correspondence to the output of the up-down counter 22, signals are selectively synthesized into a serial pulse train in which the number of pulses corresponds to the output of the up-down counter 22. The output signal of the pulse synthesizer 24 is applied to the low-pass filter 25, where the high frequency components are removed therefrom. The output of the filter 25 is a DC voltage signal corresponding to the output of the up-down counter 22. This DC voltage signal is applied to a variable capacitance diode in a tuning circuit (not shown) which has been selected by the band selecting switch 26, so that the respective frequency tuning is carried out.

On the other hand, the aforementioned higher bits signal is applied to the frequency display unit 23, and the frequency received is therefore displayed digitally. The operation of the circuit in manual operation is as described above.

The preset station selection operation will be described. In an operative condition where a desired station has been selected in accordance with the method described above, first the preset switch 31 is turned on, and then one of the channel selecting switches 27a through 27e is turned on to correspond to a channel intended to be preset. As a result, the write signal W is applied to the read-write memory 29 by the control circuit 30. Accordingly, the count output of the up-down counter 22, that is, a digital signal representative of a tuning frequency being received is stored in an address specified by the output of the band selecting switch 28 and the output of the channel selecting switch (27a through 27e) is turned on. Similarly, desired frequencies can be preset for other channels.

Then, an address at which a digital signal corresponding to a desired station has been stored is specified by operating the band selecting switch 28 and one of the channel selecting switches 27a through 27e. In this case, since the preset switch 31 is in the "off" state, the load signal L is applied to the up-down counter 22 by the control circuit 30. As a result, the read-write memory 29 reads, as the address, the outputs of the band selecting switch 28 and the channel selecting switch (27a through 27e). The read-out signal of the read-write memory 29 is supplied in a parallel mode to the up-down counter 22.

The output of the up-down counter 22 is supplied to the digital synthesizer 24. Thus, the station selection is accomplished in a manner similar to the case of manual operation.

As is clear from the above description of the first embodiment in the electronic tuning type receiver according to this invention, the disable signal is provided when the power switch is turned off and it suspends operations of the up-down counter and the pulse oscillator in the tuning voltage generating section. Accordingly, the present invention has a number of advantages in that the power consumption required for holding the storage for the period of time during which the power switch is maintained turned off is greatly reduced and the erroneous operation of the up-down counter, which may be caused when the power switch is turned off, can be prevented.

Referring now to FIG. 5 a second preferred embodiment of the receiver aspects of this invention is shown in which like elements have the same designations as in FIG. 4. In the FIG. 4 embodiment a condition may occur where the detection signal is provided as a result of the detection of the "off" state of the electric source in a condition where the pulse synthesizer is providing a high level output. The auxiliary electric source having a capacitor will use the stored power to deliver the high level output of the pulse synthesizer. As a result the stored signal can no longer be maintained in the memory. Hence, the FIG. 5 embodiment provides a protection circuit to overcome this potential problem.

The receiver of FIG. 5 is identical to the FIG. 4 embodiment except for the detection circuit 35 used in place of the enable terminal 32 of FIG. 4.

The receiver of FIG. 5 uses the detection circuit 35 for detecting the "off" state of the electric source (hereinafter referred to as an "off" state detection circuit 35 when applicable). The "off" state detection circuit 35 operates to supply a disable signal to the pulse oscillator 23, the pulse synthesizer 24 and the read-write memory 29 in a manner similar to the FIG. 3 embodiment. The "off" state detection circuit 35 is made up of an inverter 35a inverting the output of the electric source Vcc, an inverter 35b inverting the output of the pulse synthesizer 4, and a NAND gate 35c detecting the coincidence between the outputs of the two inverters 35a and 35b.

In the circuit of FIG. 5 when the electric source Vcc is supplied, the output of the inverter 35c of the "off" state detection circuit 35 has a low level (hereinafter referred to merely as "L" when applicable). Therefore, the output of the NAND gate 35c is raised to a high level (hereinafter referred to merely as "H" when applicable), and the relevant circuits are operable. Hence in this condition of operation, the pulse generator 21 is actuated to generate, for instance, an up-pulse U that is applied to the up-down counter 22. As a result, the up-down counter 22 successively counts up the clock pulses KC generated by the pulse generator 21.

The parallel count output of the up-down counter 22 is applied to the pulse synthesizer 24. The signals of the stages obtained by subjecting the oscillation signal of the pulse oscilator to frequency division in correspondence to the output of the up-down counter 22 are selectively synthesized into a serial pulse train. The number of pulses corresponds to the output of the up-down counter 22. The output signal of the pulse synthesizer 24 is applied to the low-pass filter 25, where the high frequency components are removed therefrom and as a result a DC voltage signal corresponding to the output of the up-down counter 22 is obtained. This DC voltage signal is applied to a variable capacitance diode in a tuning circuit (not shown) which has been selected by the band selecting switch 26, so that respective frequency tuning is effectuated. On the other hand, the aforementioned higher bit signal of the up-down counter 22 is applied to the frequency display unit 33 and the frequency received is digitally displayed. Hence, operation is identical to the FIG. 4 embodiment in terms of receiver function. The same is true in the case of manual operation.

When the output of the pulse synthesizer 24 has a low signal "L" with the electric source Vcc being in "off" state, both of the outputs of the inverters 35a and 35b are in the "off" state, and the output of detecting circuit 35 is raised to "H". As a result, the output of the NAND gate 35c is changed to "L", and a signal "L" is delivered out of the "off" state detecting circuit 35. The signal "L" is applied to the pulse oscillator 23 and the pulse synthesizer 24 to suspend the operation of the pulse oscillator 23 and the pulse synthesizer 24 to thereby eliminate the power consumption by those elements. The signal "L" is also applied to the read-write memory 29 so that the memory 29 will consume only that current necessary to maintain its present memory content.

Accordingly, as shown in FIG. 4 the operation of the pulse synthesizer 24 is suspended in a "L" state where no output is provided thereby, and therefore the pulse synthesizer 24 consumes no electric power. That is, in this case, the electric power required is only for the current into the read-write memory 29 in rest state, and accordingly the amount of current consumed is considerably reduced. Hence, the storage in the read-write memory can be maintained for many hours with only an auxiliary electric source employing a capacitor. Furthermore, when a station selection is completed by tuning, the operation of the pulse oscillator 23 is stopped, and accordingly, interference in receiving amplitude modulation radio waves can be prevented.

As was described above, according to the electronic tuning type receiver of the FIG. 4 embodiment, the timing of stopping the operation of the pulse synthesizer forming the digital-to-analog converter section is selected so as to stop the operation of the pulse synthesizer with the consumption current being zero. The period of time for maintaining the storage in the memory can be considerably increased with the auxiliary electric source after the power switch is turned off.

It is apparent that various modifications can be made without departing from the essential concepts of the invention as described herein.

We claim:
1. In a system having a source of electric power, a memory for storing a digital input value and a digital-to-analog converter section for generating an output signal corresponding to an output of the memory, the improvement comprising, means responsive to a low level signal output from both said digital-to-analog converter and said source of electric power to generate a disable signal to said digital to analog converter.

2. The system of claim 1 further comprising a low pass filter coupled to the output of the digital-to-analog converter section.

3. The system of claim 1 further comprising clock means for supplying timing signals to said memory and said digital-to-analog converter section.

4. The system of claim 3 wherein said means responsive to said low level signal output comprises a first inverter responsive to the output of said power source, a second inverter responsive to the output of said digital-to-analog converter section and a NAND gate receiving the outputs of said first and second inverters.

5. The system of claim 4 wherein the output of said NAND gate is supplied as said disable signal to said digital-to-analog converter section and to said clock means.

6. The system of claim 5 wherein said NAND gate generates a disable signal when both the outputs of said inverters are a high level in response to low signal levels from said power source and said digital-to-analog converter section.

7. The system of claim 6 further comprising a low pass filter coupled to the output of the digital-to-analog converter section.

8. The system of claim 2 wherein said digital-to-analog converter section comprises an oscillator, and a pulse synthesizer, said pulse synthesizer producing an output train of pulses having a number of pulses corresponding to the output of said memory.

9. The system of claim 8 further comprising an up-down counter interposed between said memory and said pulse synthesizer.

10. The system of claim 9 further comprising pulse generator means coupled to said up-down counter for providing clock pulses and counting pulses to said counter.

11. The system of claim 10 further comprising means to display the output of said counter.

12. The system of claim 11 wherein said means to generate a disable signal comprises a first inventer coupled between said source of power and said digital-to-analog converter.

13. The system of claim 12 further comprising a second inverter, said second inverter responsive to the output of the pulse synthesizer, and a NAND gate receiving the outputs of said first and second inverters.

14. The system of claim 13 wherein said NAND gate delivers said disable signal to said digital-to-analog converter.

15. The system of claim 14 wherein said digital-to-analog converter comprises an oscillator, a pulse synthesizer receiving pulses from said oscillator and a low pass filter receiving the output of said synthesizer and wherein said second inverter is responsive to the output of said synthesizer and said NAND gate delivers said disable signal to said oscillator.

16. The system of claim 3 wherein said disable signal is supplied to said memory to supply power to said memory during a power off period of said system.

17. The system of claim 1 wherein said disable signal is supplied to said memory to supply power to said memory during a power off period of said system.

18. The system of claim 1 wherein said system is an electronic tuning type of receiver comprising band select switch means, said memory receiving the output of said switch means, a control circuit to deliver a write instruction to said memory and output means coupled to said select switch means to receive the output of said digital-to-analog converter section.

19. The receiver of claim 18 further comprising an up-down counter interposed between said memory and said digital-to analog converter, said up-down counter responsive to said control circuit to receiver memory signals when said switch means is actuated.

20. The receiver of claim 19 further comprising a pulse generator coupled to said up-down counter to provide clock pulses to said counter.

21. The receiver of claim 20 further comprising means to display the contents of said counter.

22. The receiver of claim 19 wherein said means to generate a disable signal comprises a first inverter coupled between said source of power and said digital-to-analog converter.

23. The receiver of claim 22 further comprising a second inverter, said second inverter responsive to the output of the digital-to-analog converter section and, a NAND gate receiving the outputs of said first and second inverters.

24. The receiver of claim 23 wherein said NAND gate delivers said disable signal to said digital-to-analog converter.

25. The receiver of claim 24 wherein said NAND gate delivers said disable signal to said memory during a power off period of said receiver.

26. The receiver of claim 25 wherein said digital-to-analog converter comprises an oscillator, a pulse synthesizer receiving pulses from said oscillator and a low pass filter receiving the output of said synthesizer and wherein said second inverter is responsive to the output of said synthesizer and said NAND gate delivers said disable signal to said oscillator.

* * * * *